United States Patent [19]

Lloyd et al.

[11] 4,402,055

[45] Aug. 30, 1983

[54] AUTOMATIC TEST SYSTEM UTILIZING INTERCHANGEABLE TEST DEVICES

[75] Inventors: Raymond A. Lloyd, Laurel; Larry L. Charles, Fallston; William F. Susie, Cockeysville; Allen W. Tate, Jr., Odenton; James R. Reeder, Timonium, all of Md.

[73] Assignee: Westinghouse Electric Corp., Pittsburgh, Pa.

[21] Appl. No.: 229,029

[22] Filed: Jan. 27, 1981

[51] Int. Cl.³ .............................................. G06F 11/00
[52] U.S. Cl. ................................... 364/579; 364/900; 364/580; 371/20; 324/73 AT
[58] Field of Search ............... 364/579, 580, 900, 200; 371/20; 324/73 R, 73 AT

[56] References Cited

U.S. PATENT DOCUMENTS

| | | | |
|---|---|---|---|
| 3,694,632 | 9/1972 | Bloomer | 364/579 X |
| 3,825,901 | 7/1974 | Golnek, Sr. et al. | 364/200 |
| 4,186,438 | 1/1980 | Benson et al. | 364/200 |
| 4,200,930 | 4/1980 | Rawlings et al. | 364/200 |
| 4,212,059 | 7/1980 | Sato et al. | 364/200 |
| 4,280,220 | 7/1981 | Vaeches | 364/580 X |

*Primary Examiner*—Edward J. Wise
*Attorney, Agent, or Firm*—J. B. Hinson

[57] ABSTRACT

An automatic test system controlled by a general purpose digital central processor is disclosed. The central processor accepts test programs in a high level compiler language such as Atlas. The Atlas program is compacted into a simplified language which is utilized to communicate with test devices via a standard IEEE 488 data bus. Each of the test devices includes a programmable interface digital processor which performs any translation that may be necessary in order to permit specific test instruments coupled to the central processor via the interface processor to perform the tests specified by the high level test programs. A switching matrix also communicates with the digital processor to connect the appropriate test device to the unit under test.

9 Claims, 11 Drawing Figures

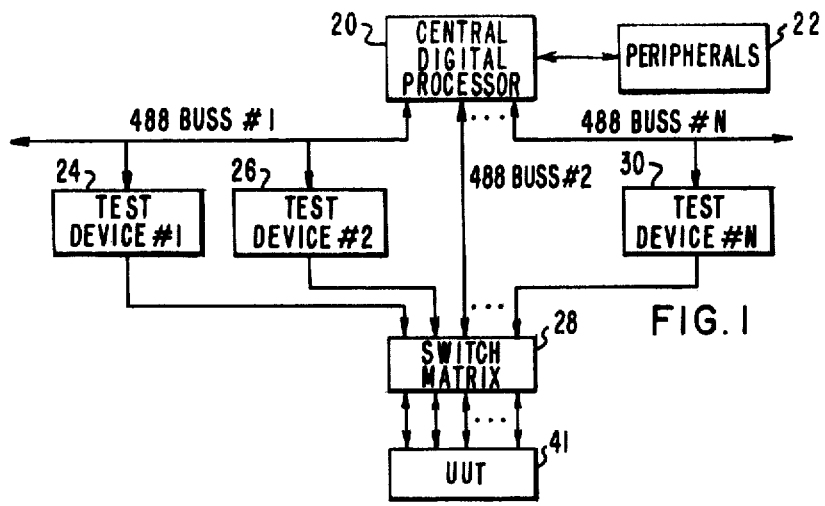
FIG. 1
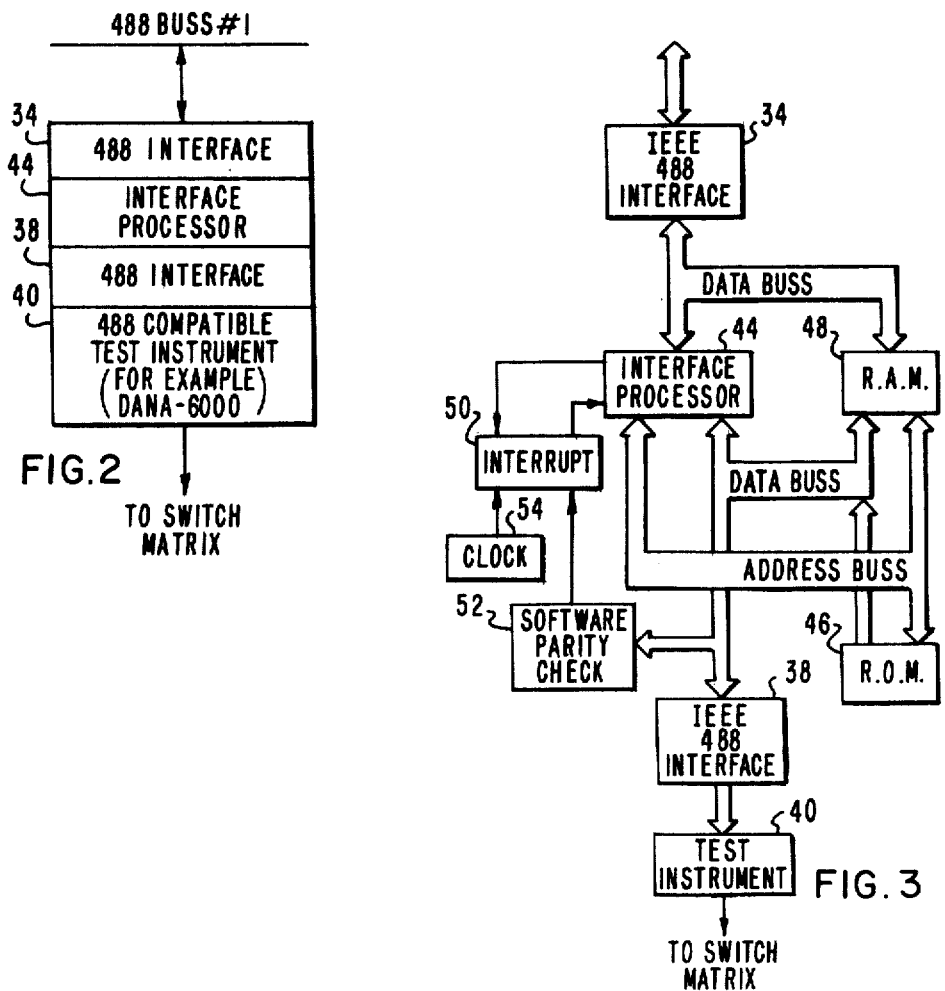
FIG. 2
FIG. 3

AUTOMATIC TEST SYSTEM UTILIZING INTERCHANGEABLE TEST DEVICES

Statement of Government Interest

This invention was either conceived or first reduced to practice under Contract F33657-78-C-0503 with the United States Department of Defense.

BACKGROUND OF THE INVENTION

1. Field of the Invention

The invention relates to automatic test systems and more specifically to automatic test systems utilizing interchangeable test devices.

2. Description of the Prior Art

Typical prior art automatic test systems have utilized a general purpose digital computer which was programmed to operate a plurality of test instruments via the output bus of the processor. In these systems, the test instruments were typically supplied by a variety of manufacturers with each requiring its own unique instructions in order to perform its specified test function. In these systems if it was required to change one test instrument to its functional equivalent from, say, a different manufacturer, it was necessary to reprogram the digital processor.

SUMMARY OF THE INVENTION

The preferred embodiment of the invention comprises a test system for supplying test signals to apparatus to be tested and for evaluating the response of the apparatus to these signals. The system includes a general purpose programmable central digital processor for accepting programs in a high level language, such as Atlas, with the program specifying the test to be performed. A plurality of interchangeable test devices, each including a programmable interface processor and a test instrument are coupled to communicate with the central digital processor via a data bus. A switch matrix is also coupled to receive switching commands from the central processor to couple the input output lines of the test instruments to the system to be tested. The programmable interface processor is programmed to provide a communication path between the test instruments and the central digital processor.

DESCRIPTION OF THE DRAWINGS

FIG. 1 is a block diagram of the preferred embodiment of the invention;

FIG. 2 is a simplified functional block diagram of a test device usable in the system illustrated in FIG. 1;

FIG. 3 is a detailed block diagram of a typical test device; and

DESCRIPTION OF THE PREFERRED EMBODIMENT

Figure 4A:
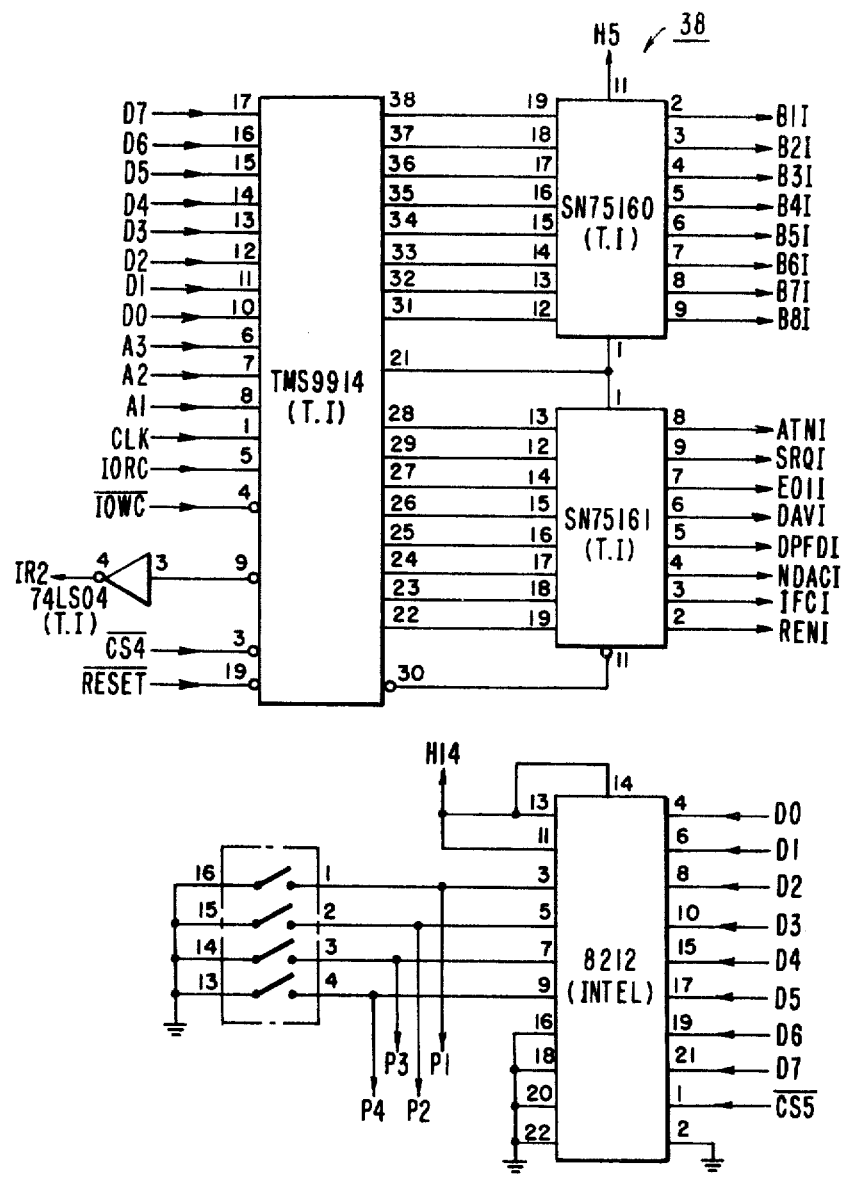
FIGS. 4A through 4H are a complete schematic diagram, including part numbers and manufacturer, of the interface processor and its I/O channels, memories and control circuits.

The preferred embodiment of the invention includes a general purpose central digital processor 20 which communicates with the operator through a collection of peripheral devices 22. The peripheral devices 22 may include for example typewriters, printers, external memories, and other devices generally used as I/O peripherals for digital processors. The central digital processor 20 communicates with various test devices for performing tests via a standard IEEE 488 bus structure. Typical test devices are illustrated at reference numerals 24, 26 and 30. The IEEE 488 bus structure is well known in the art and will not be described in detail herein. Other data buses are also usable.

In most applications, the typical test system as illustrated in FIG. 1 will be programmed to perform a variety of tests on the unit under test. (A typical unit under test (UUT) might be a radar system and is functionally illustrated at reference numeral 41). For example, the system may be required to supply voltage, current or frequency input signals to the unit under test and it may be required to measure the responses of the unit under test in terms of voltage current, frequency or other well known electrical parameters. There are many programmable digital test instruments available in the commercial market to perform these test functions and the operation of a typical member of this family will be described later. However, each manufacture of a class of test instruments, voltmeters for example, have different interface requirements (i.e. logic levels, command structure, command formats, pin assignments and command protocols) make reconfiguring a test system or interchanging a test instrument for a similar one or a different manufacture difficult because prior art systems provided no method of resolving these differences except by reprogramming the central processor.

A typical central digital processor 20 will include a plurality of standard IEEE 488 data buses. In the system illustrated in FIG. 1, three of these buses are illustrated, by way of example. In FIG. 1, data bus 1 is shown as communicating with two test devices 24 and 26 which are labeled 1 and 2, for convenience of illustration. These two test devices 24 and 26 are examples and additional instruments could also be added to data bus 1. This is possible because each test device is assigned an address compatible with the 488 data bus structure. Data bus #2 has been assigned to communicate with a switching matrix 28 while data bus #3 is illustrated as communicating with a generalized test instrument labeled test instrument "N" and indicated as reference numeral 30. As previously discussed with respect to data bus #1, additional test instruments can be assigned to communicate with the processor 20 via either of the illustrated data buses or via additional data buses.

FIG. 2 is a somewhat functional block diagram of a typical test device utilized in the system described above. In the specific example, the DANA 6000 volt meter is utilized as a test instrument to measure voltages. It should be emphasized however that the DANA 6000 is a typical test instrument and other instruments having similar measurement capabilities may be used. If the system is reconfigured to utilize a different test instrument, the data interchanged between the central processor 20 and the test device via the 488 data bus will not be changed either in content or form. Possible changes in the instrument requirements and characteristics are accommodated by reprogramming the interface processor 49 (FIG. 2).

From a hardware standpoint, the typical test device illustrated in FIG. 2 includes four basic sections. A first 488 interface unit 34 is utilized to couple a programmable digital interface processor 44 to the IEEE 48 data bus #1. Similarly, a second 488 interface 38 couples the interface processor 44 to the typical test instrument 40 for example, the DANA 6000 volt meter. Functionally, the first 488 interface unit 34 couples the interface processor 44 to the 488 bus permitting it to communicate with the central processor 20. The interface processor 38 accepts these program instructions from the central processor 20 and converts then into a format acceptable by the test instrument and couples these instructions to the test instrument 40 through a second IEEE 488 interface unit 38. In response to the instructions from the interface processor 44, the test instrument 40 performs the specified measurement functions including returning the results of the measurement to the central processor 20.

It is desirable to point out that in setting up the system to perform voltage measurements using the DANA 6000 for example, appropriate instructions are also sent to the switch matrix 28 from the processor 20 to connect the appropriate terminals of the DANA 6000 to the unit under test 41 illustrated in FIG. 1. This function is facilitated by including in the switching matrix 28 an interface processor.

The operation of the test system illustrated in FIG. 1 will not be described with reference to a typical voltage measurement. The central digital processor 20 will be assumed to be programmed in Atlas. A compact form of Atlas will be utilized to communicate with the Dana 6000 via a standard 488 interface bus. Voltage measurements are a typical function performed by the system and the programming and operation of the system for performing other types of functions are similar with appropriate changes made to account for the different type of test being made.

The voltage measurement to be discussed in detail will utilize a DANA 6000 volt meter and it will be assumed to be incorporated into test instrument 1 as a portion of this device. To perform this measurement, the following program is utilized.

---
SAMPLE PROGRAM
---
MEASURE, (VOLTAGE) DC-SIGNAL (USING "DANA-6000"), VOLTAGE
ATLAS PROGRAM FOR CENTRAL PROCESSOR 20
28.46V, NOISE-REJ 46 DB, CNX HI J1-6, LO J3-4 &
OPEN - TO SWITCH
DISCONNECT - TO SWITCH
SETUP TO DANA/IAU
CONNECT - TO SWITCH
CLOSE - TO SWITCH
READ TO DANA/IAU
COMPACT ATLAS TO TEST INSTRUMENT 24
ASSUME DANA 6000 CONNECTED AS LISTENER/TALKER 3 ON
BUS #1
SETUP COMMAND
ICP T10, L13, SET, DCS, (V), V 28.46V, NREJ 46DB &,
CK ABCD $\begin{smallmatrix}C&L\\R&F\end{smallmatrix}$
DANA F1R6T3D1P115J1V1 $\begin{smallmatrix}C&L\\R&F\end{smallmatrix}$
INST. FROM INTERFACE PROCESSOR TO DANA 6000
READ
ICP T10, L13, RED, DCS, (V, 4C67) &; CK A476 $\begin{smallmatrix}C&L\\R&F\end{smallmatrix}$ Compact
DATA TO $\begin{smallmatrix}C&L\\R&F\end{smallmatrix}$ Atlas
DANA 6000 TO INTERFACE PROCESSOR
MEASUREMENT RETURNED
DANA +.295E+2 $\begin{smallmatrix}C&L\\R&F\end{smallmatrix}$ +29.5
ICP T13, L10, MEA, (4C67), +.295E+2V, CK4762 $\begin{smallmatrix}C&L\\R&F\end{smallmatrix}$

---

FIG. 3 is a more detailed block diagram of the test device of the type illustrated in FIG. 2. In FIG. 3, the IEEE 488 interface circuits 34 and 38, the interface processor 44, and the test instrument 40 are identified with the same reference numerals as in FIG. 2 to indicate the identity of these devices. As illustrated in FIG. 3, the IEEE interface units 34 and 36 communicate with an interface processor 44. In general, the interface processor 44 will be a microprocessor and as such will not include any internal program or data memory. This being the case, programs to operate the interface processor 44 are stored in a read only memory 46. The details of this program will change from test instrument to test instrument and in all cases will provide sufficient data processing to convert from the language available on the IEEE 488 bus of the central processor 20 to the format instruction required by the specific test instrument. Thus, each test device will include its own interface processor which is programmed to made the test instrument utilized by the test device compatible with the data bus of the central processor 20. This permits test devices having test instruments of similar functional capability to be easily interchanged.

In performing the data processing functions necessary to operate the test instrument associated with the interface processor 44, some random access read/write memory will be required. This capability is provided by a random access read/write memory 48. The interface processor 44 communicates with both of these memories via the standard bus structure of the interface processor.

The sequence of operations of the interface processor 44 are controlled by an interrupt circuit 50. The interrupt circuit 50 also receives inputs from a software parity check 52. A parity check 52 is performed on all the data into and out of the IEEE 488 interface circuit 38 to assure that no errors have been introduced. Timing for the entire operation is provided by a real time clock circuit 54.

Figure 4B:
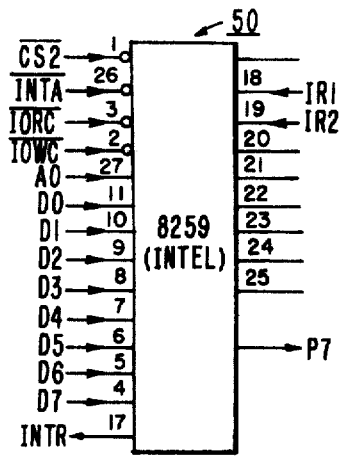
Figure 4C:
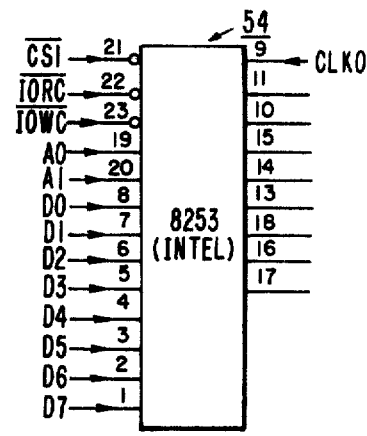
Figure 4D:
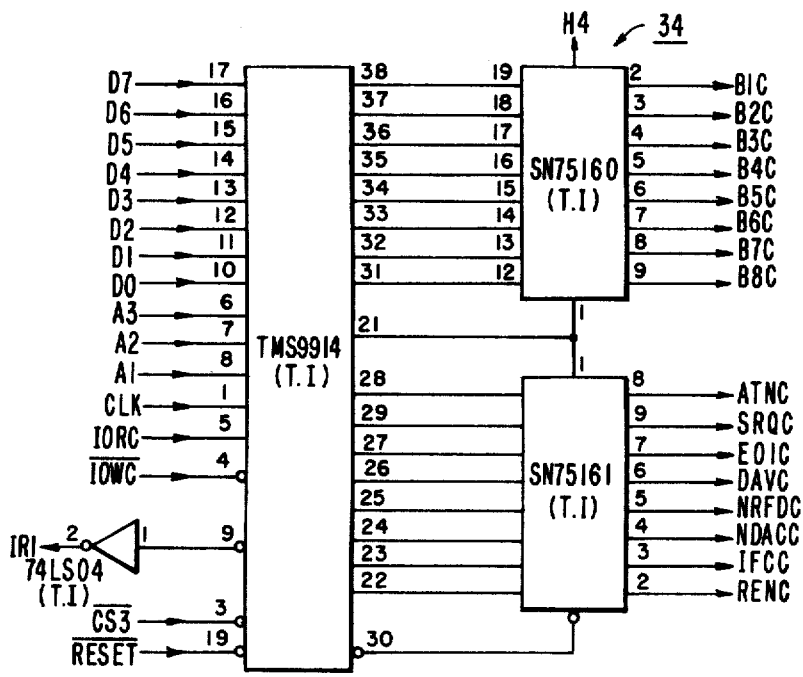
Figure 4E:
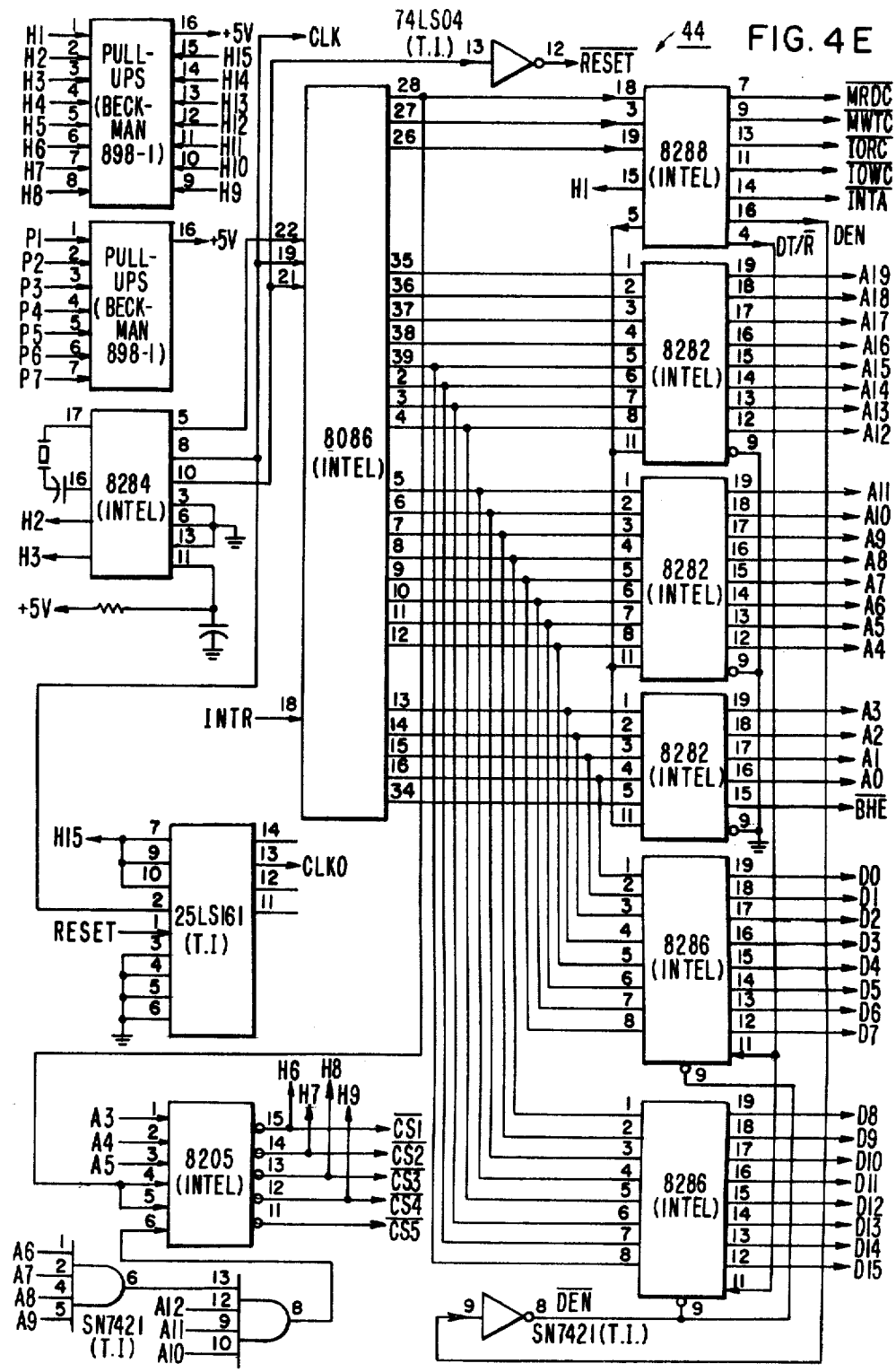
Figure 4F:
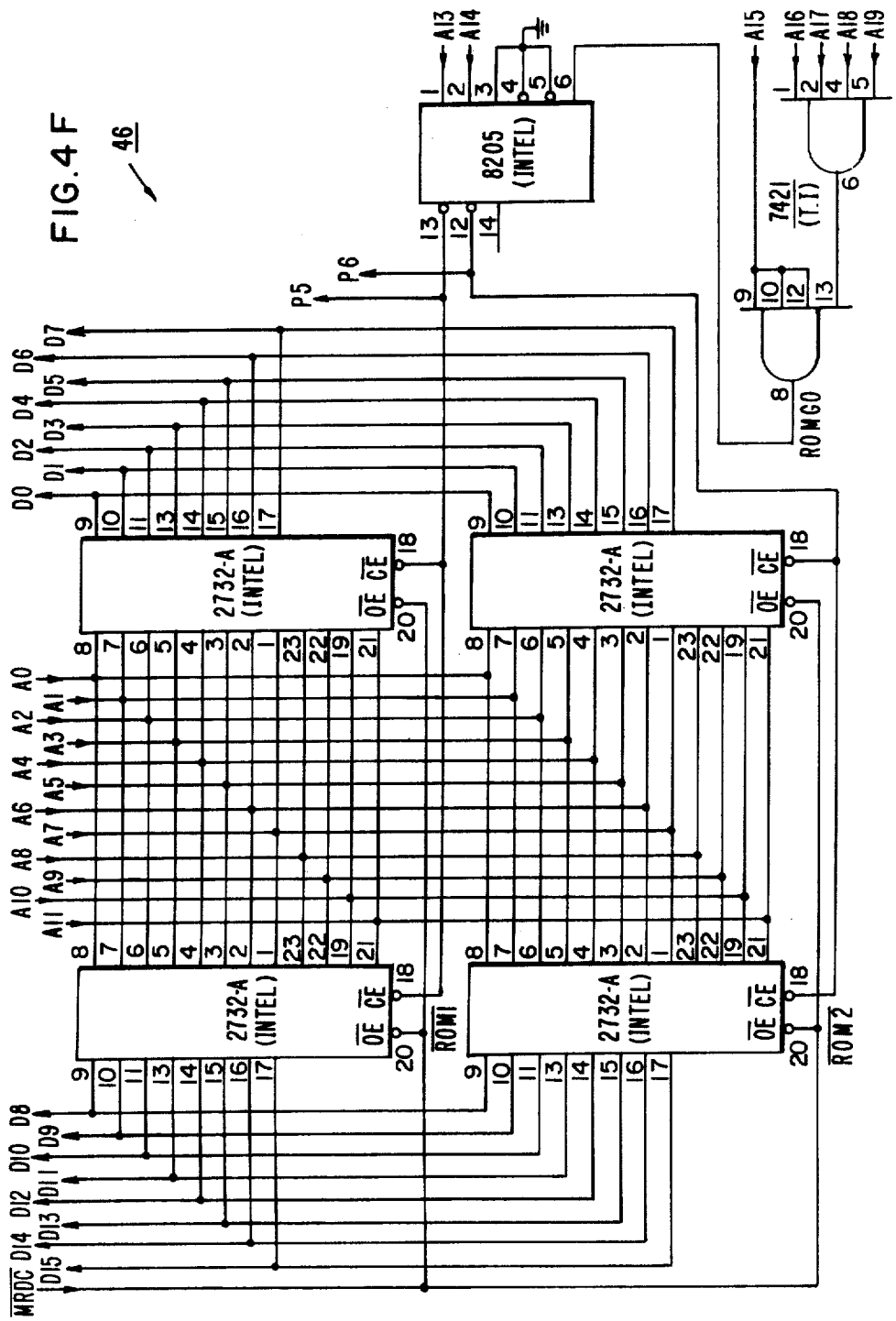
Figure 4G:
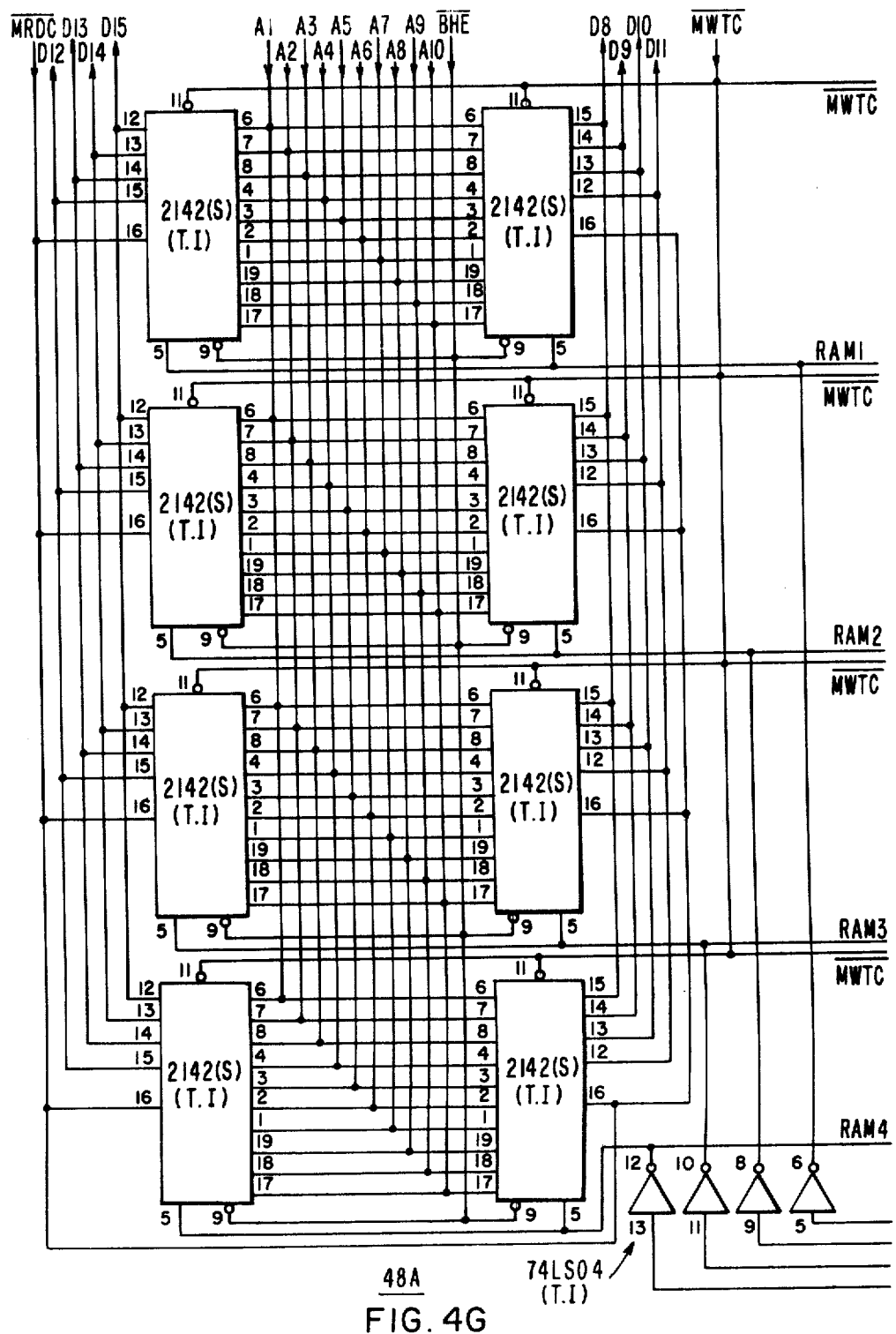
Figure 4H:
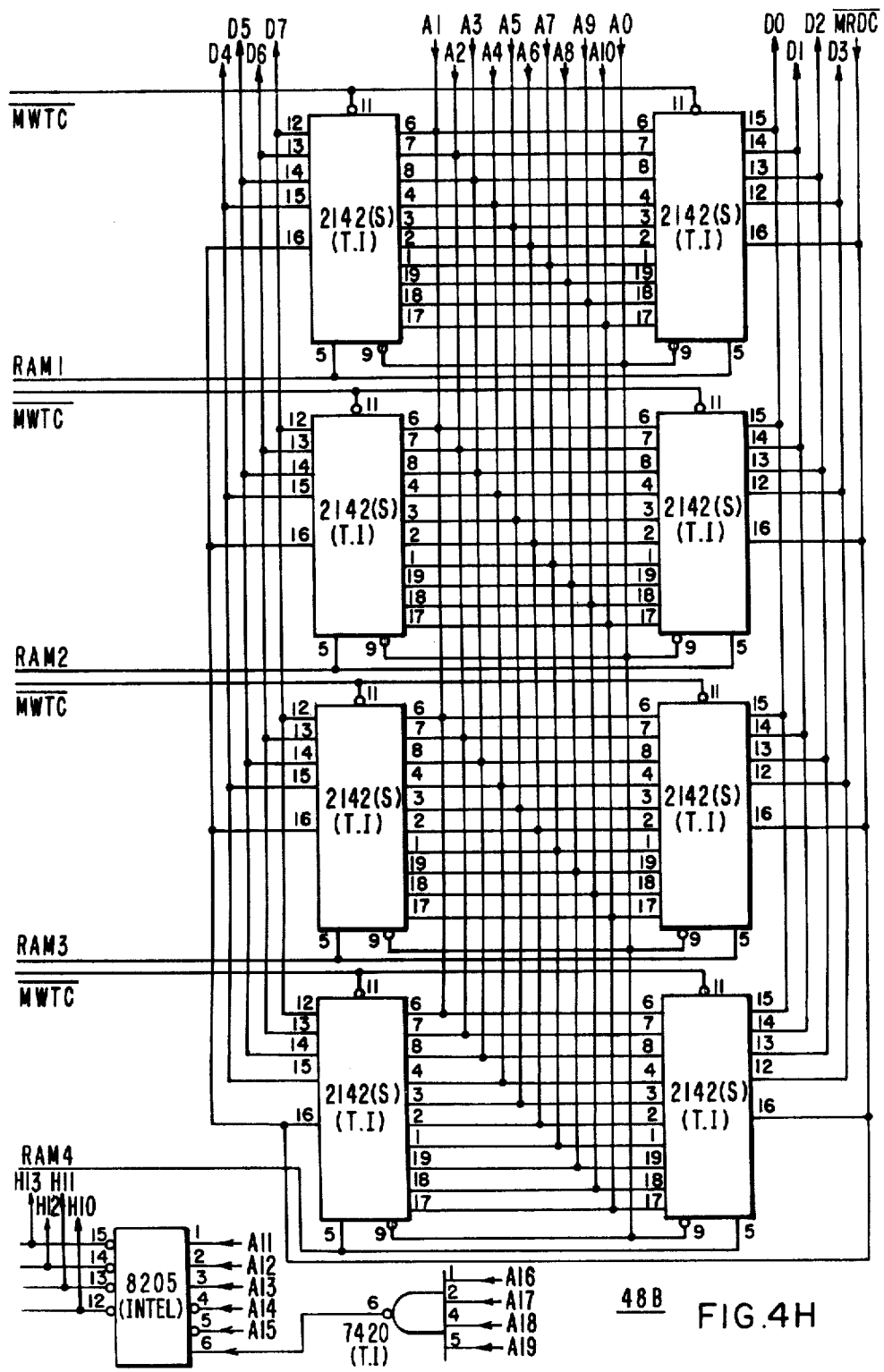

FIGS. 4A through 4H are complete schematic diagram for constructing the interface processor 44, interfaces 34 and 38, memories 46 and 48, interrupt 50 and the real time clock 50. Dotted lines have been utilized in FIG. 4 to identify all of the functions illustrated in FIG. 3. The circuit illustrated in FIG. 4 can be constructed using standard off-the-shelf components with the appropriate commercial part number and manufacturer being indicated on the diagram. Therefore, no line-by-line description of the circuits illustrated in FIG. 4 has been included.

The central processor 20, the switching matrix 28 and the peripherals 22 may also be commercially available devices. Programming techniques for the read only memory 46 (FIG. 3) will depend on the memory selected. However, in all cases suitable programming techniques are available.

We claim:
1. A test system, comprising in combination:
   a. a central programmable digital processor for accepting a test program in a first high level compiler language, said program comprising a plurality of program sequences each specifying a test to be performed on a unit under test;
   b. a plurality of test devices each including a programmable processor and at least one test instrument coupled to communicate with said programmable digital processor via a data bus using a compacted (i.e. simplified version) of said high-level compiler language;

c. a switch matrix coupled to receive switching commands from said programmable digital processor via a data bus and the data input/output line from said test devices; wherein d. each sequence of said program in said first high level compiler language specifying a test to be performed is compacted by said programmable digital processor to produce program sequences in said compact version of said first high level compiler language with portions of said program sequences in said compact version of said high level compiler language relating to one of said test instrument being coupled to said programmable processor comprising a portion of at least one of said plurality of test devices which in response thereto generates the signals required by said at least one test instrument to perform the specified test and to said switch matrix to couple said at least one test instrument to said apparatus to be tested.

2. A test system in accordance with claim 1 wherein each of said test devices includes a programmable digital processor.

3. A test system in accordance with claim 2 wherein each of said programmable digital processors are coupled to said central processor to selectively receive instructions from said central processor and in response thereto control a specific test instrument causing said specific test instrument to perform test specified thereby and couple the results of said test to said central processor.

4. A test system in accordance with claim 3 wherein said switching matrix includes a programmable digital processor for receiving instructions from said central processor and in response thereto coupling one of said test devices to apparatus to be tested.

5. A test device for use in an automatic test system, said test system being controlled by a central programmed digital processor utilizing program sequences in a high level compiler language; said test device comprising:

a. a first interface unit for coupling to the data bus of said central programmed processor;

b. a programmable digital processor coupled to communicate with said central programmable digital processor via said first interface unit;

c. a digitally controlled test instrument; and d. a second interface unit coupling said programmable digital processor to said digitally controlled test instrument.

6. A test device in accordance with claim 5 wherein said interface processor includes a read only memory for storing programs.

7. A test device in accordance with claim 6 wherein said programmable digital processor includes a read/write memory for data processing.

8. A test system in accordance with claim 7 wherein said read only memory is a random access memory.

9. A test device in accordance with claim 8 wherein said read/write memory is a random access memory.

* * * * *